United States Patent [19]
Takaki et al.

[11] Patent Number: 6,060,929
[45] Date of Patent: May 9, 2000

[54] SIGNAL DELAY APPARATUS

[75] Inventors: Kouichi Takaki; Mitsuo Azumai, both of Hachioji, Japan

[73] Assignee: Konica Corporation, Tokyo, Japan

[21] Appl. No.: 08/928,152

[22] Filed: Sep. 12, 1997

[30] Foreign Application Priority Data

Sep. 20, 1996 [JP] Japan .................................. 8-250321

[51] Int. Cl.[7] .................................................. H03H 11/26
[52] U.S. Cl. ......................... 327/262; 327/269; 327/270
[58] Field of Search .................... 327/261, 262, 327/263, 269, 270, 271, 276, 277, 284, 285, 362

[56] References Cited

U.S. PATENT DOCUMENTS 5,216,301  6/1993  Gleeson, III et al. .
5,514,990  5/1996  Mukaine et al. .

FOREIGN PATENT DOCUMENTS

| 0 311 237 A2 | 4/1989 | European Pat. Off. . |
| 0 425 302 A2 | 5/1991 | European Pat. Off. . |
| 0 487 902 A2 | 6/1992 | European Pat. Off. . |
| 5-275788 | 10/1993 | Japan .............................. H01S 3/133 |
| WO 96/17389 | 6/1996 | WIPO . |

*Primary Examiner*—Toan Tran
*Assistant Examiner*—Quan Tra
*Attorney, Agent, or Firm*—Frishauf, Holtz, Goodman, Langer & Chick, P.C.

[57] ABSTRACT

A delay signal generating apparatus incorporated in an integral circuit, includes a plurality of serially-connected delay elements for delaying an input signal successively and for outputting plural delay signals, a heat generating circuit for heating the plurality of delay elements, and a heat controller for controlling a heat amount generated by the heat generating circuit so as to change the delay time of each of the plural delay signals.

10 Claims, 10 Drawing Sheets

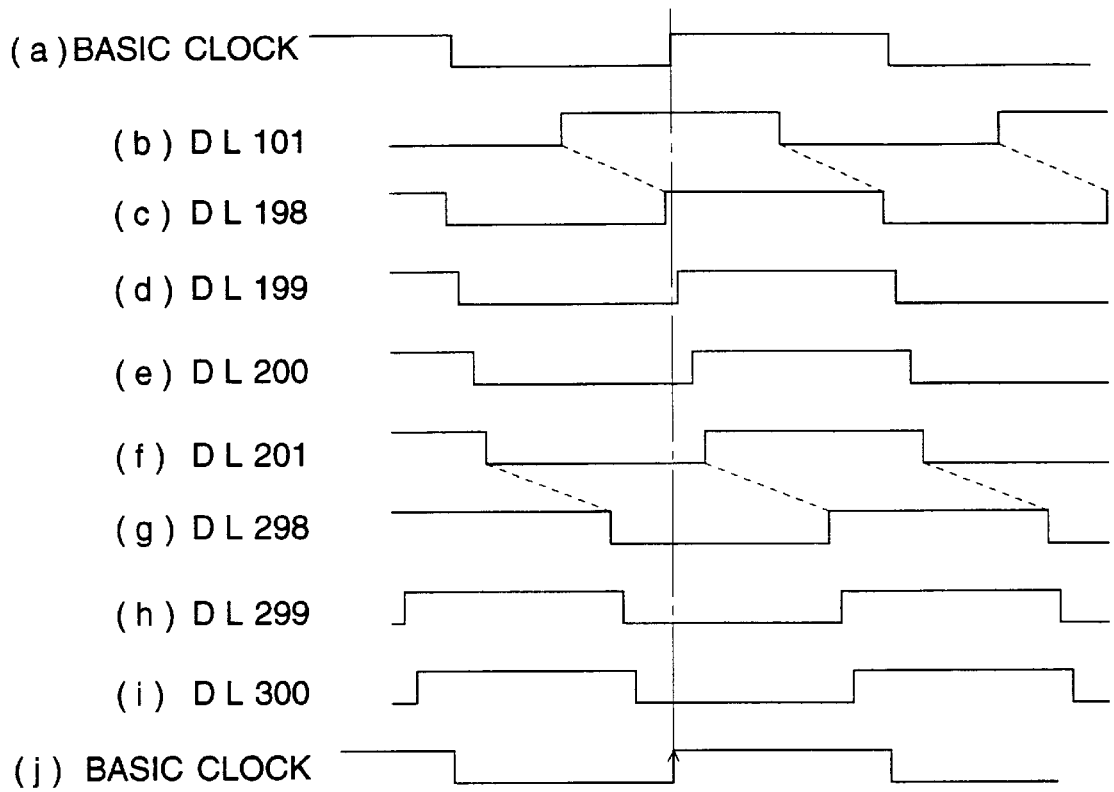

SIGNAL DELAY APPARATUS

BACKGROUND OF THE INVENTION

The present invention relates to a signal delay apparatus, and more particularly, to a signal delay apparatus capable of obtaining delay signals which are highly accurate.

Heretofore, when causing a certain signal to have a given delay time, it has been common to use a delay line available on the market. A type of the internal structure of such a delay line includes a distribution constant type having a structure like those of a coaxial cable and a delay cable, and a concentration constant type composed of discrete L and C, which make it possible to obtain accurate delay signals.

However, an analog delay line of this kind has a disadvantage in that it is extremely expensive.

On the other hand, as a method to obtain delay signals inexpensively, it can be considered to obtain desired delay time by linking plural delay elements each being an integral circuit composed of a digital circuit. In this method, however, it is impossible to obtain delay signals satisfying the necessary accuracy requirements, because the method has a disadvantage in that delay time is greatly influenced by dispersion in manufacturing steps and by variation of temperature, humidity and power voltage.

In order to enhance accuracy, therefore, there sometimes is used a mixture type delay line wherein an analog delay line is employed outside a digital circuit as a chip to be attached outside. However, even in this case, it has been impossible to avoid cost increase due to the matters of expenses for development and a unit price.

With regard to a delay line of a digital type, the inventors of the invention have proposed in TOKKAIHEI 5-275788 an apparatus wherein a delay signal specifically related to an input signal is detected by a standard signal detecting means from plural delay signals outputted from a signal delay means, and wherein a delay signal to be outputted by an output signal determining means based on the results of detection made by the standard signal detecting means is selectively outputted.

Though it is possible, due to this delay line, to accurately find out, from plural delay signals, the delay signal having desired delay time, the number of steps each representing an output signal determining means (selector) which finally selects the desired delay signal is increased as the desired accuracy is enhanced, making it impossible to ignore the delay generated in the selector.

For example, even when a delay signal having the desired delay time is found out at the accuracy of 1 nS from a signal delay means wherein 400 delay element steps are linked in series, a selector of 400 inputs takes 9 steps (400, 200, 100, 50, 25, 12, 6, 3. 1). Therefore, when one step of the selector includes a delay of 1 nS, the final delay of 9 nS is supposed to be generated. When it is impossible to design all path-lengths each covering from a delay element at each step to a selector at the final step to be the same, an error caused by a difference of the path-length is supposed to be generated.

Even if the desired delay signal is found out accurately, the final accuracy is lowered by a delay or an error generated in the course of selecting and outputting, which has been a problem.

Recently, in particular, image forming apparatus is required to output images at high speed, and the accuracy desired is getting higher and higher year after year. Accordingly, the number of inputs to a selector is considered to be increased, giving a hint of a possibility that a delay or an error at the selector is increased. Therefore, it is extremely difficult to finally obtain delay signals accurately.

SUMMARY OF THE INVENTION

The present invention has been achieved to solve the problems mentioned above, and its object is to provide a signal delay apparatus capable of finding out and selecting the desired delay time at high accuracy within a single integrated circuit, without using parts to be attached outside.

The object of the invention can be realized when the selected signals in a selecting section constituting a selector is reduced, and control is made by heat generation in a heat generating section provided in the same integrated circuit so that the delay time of the reduced selected signals may be the same as the desired delay time.

The invention takes advantage of the fact that the delay time of a delay element provided in an integral circuit is varied by the temperature of the integral circuit.

To be more concrete, the delay time is changed by heat generation made by the heat generating section so that the delay time of the reduced selected signals may become the same as a cycle of the standard clock. The cycle of the standard clock is mostly independent of the temperature of the integral circuit, and it is constant. Therefore, for example, if the selected signal is different from the standard clock just by one cycle, the selected signal is a signal that is delayed by one cycle of the standard clock.

In addition, since this selected signal is one controlled in terms of delay time by heat generation at the heat generating section, it can maintain the accurate delay time which is not varied by the temperature of a integral circuit, which is different from a delay element provided in a conventional integral circuit wherein the delay time is varied by the temperature of the integral circuit.

Since it is also possible to obtain an accurate delay signal by the selected signals reduced by heat control as stated above, the constitution with less circuits makes it possible to carry out rapid processing as, compared with a conventional appartus.

Further, even when the steps or the number of delay elements are designed to be highly accurate for improving accuracy (resolution), the conventional problem of increased delay or an error at a selector is avoided, because selection is made from fewer selected signals.

Further, the circuit constitution at the selecting section does not need to be increased, which is advantageous for integration, and changes with time and an influence of heat caused by the change in environmental temperature can be absorbed, because heat is positively utilized.

BRIEF DESCRIPTION OF THE DRAWINGS

FIG. 10 is a time chart for illustrating how select signals are generated in the example of the invention.

DETAILED DESCRIPTION OF THE PREFERRED EMBODIMENT

Figure 1:
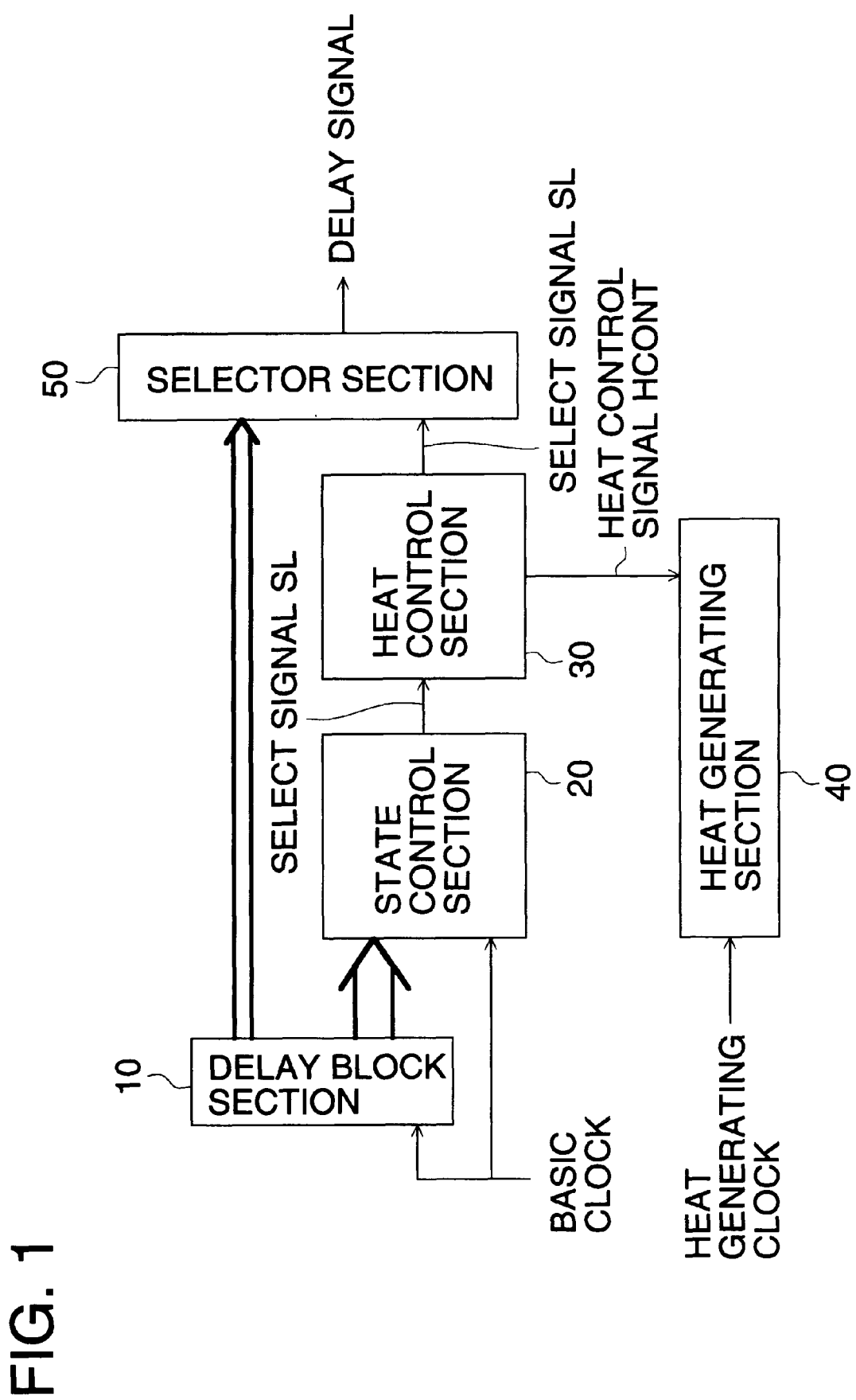
FIG. 1 is a structure diagram showing a total structure of an example of the invention.

Examples of the invention will be explained in detail, referring to the drawings. FIG. 1 is a structure diagram showing a total structure of an example of the invention.

In FIG. 1, delay block section 10 constituting a delay section represents a delay element group constituting a delay section of the invention which is for obtaining plural delay signals by delaying a standard clock by a prescribed quantity.

State control section 20 generates select signal SLxxx that receives plural delay signals from the delay block section 10, then compares plural delay signals from the delay block section with the standard clock and shows whether the signal in the plural delay signals is in the specific phase relation with the standard clock or not (which delay signal has a prescribed delay amount).

Heat control section 30 is one which controls (rough adjustment, fine adjustment and adjustment and maintenance) a quantity of heat of heat generating section 40 so that the delay block section 10 may be in the proscribed delay state in accordance with the select signal SLxxx.

Heat generating section 40 is one which is provided in the vicinity of the delay block section 10 in an integral circuit and generates heat according in terms of quantity to control (heat control signal) of heat control section 30 to adjust an amount of delay of the delay block section 10.

Selector section 50 is a selector which selects delay signals of the second delay element assigned in advance to have a requested delay time from the delay block section 10, referring to select signal SLx showing a first delay element of a defined point adjusted by the heat control section 30.

Figure 2:
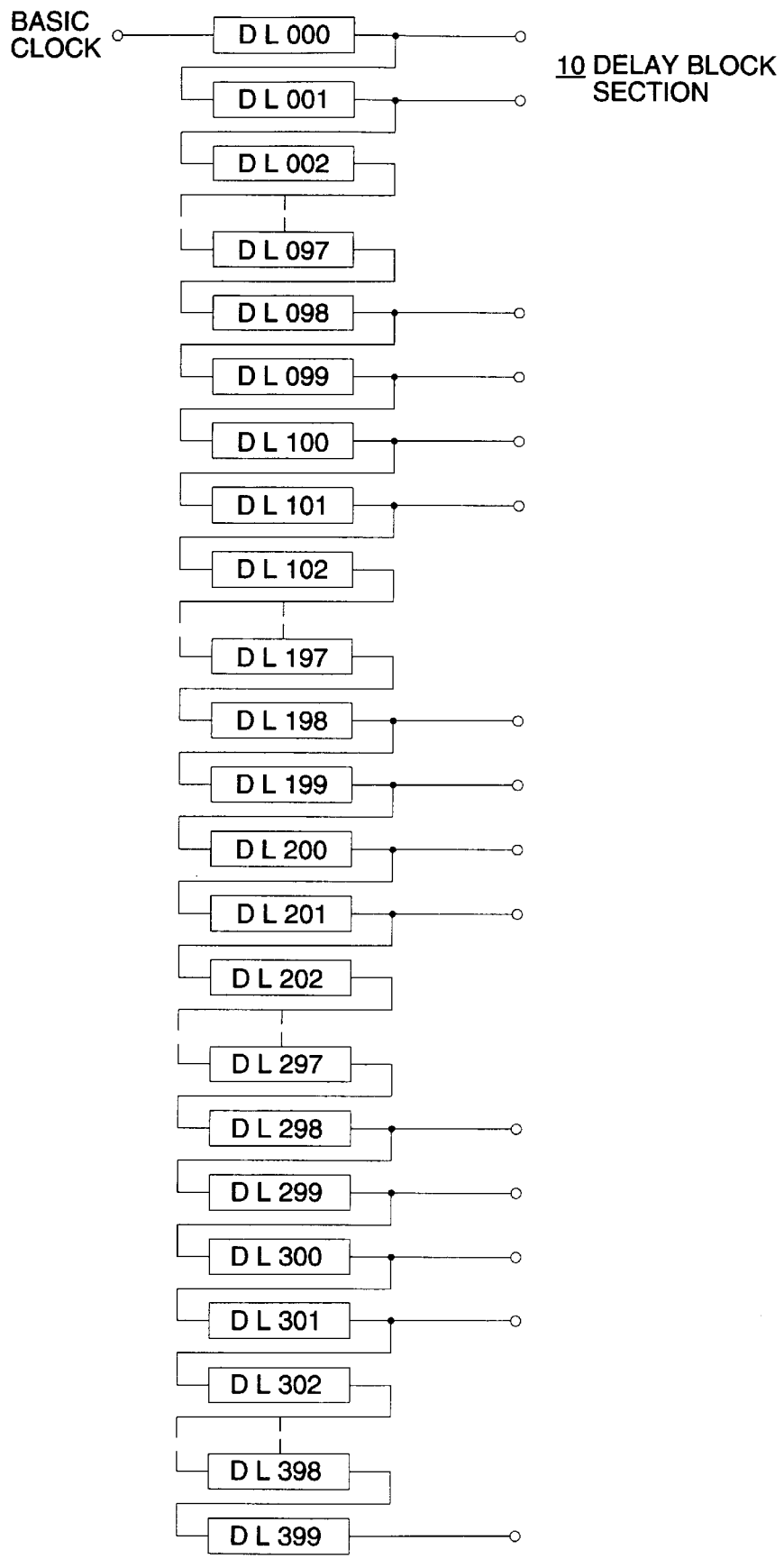
FIG. 2 is a structure diagram showing an example of the detailed structure of a delay block section used in the example of the invention.

FIG. 2 is a structure diagram showing an example of the structure of a delay element (delay module) group by the delay block section 10. In this case, there is shown an example wherein 400 steps of delay modules DLxxx (DL001–DL399) are used.

In the example shown in FIG. 2, a delay block section comprises a plurality of delay element steps each being represented by a combination of two internal cells (inverters) of an integral circuit (two invertor logic).

Incidentally, a delay element group is not limited to the foregoing, and a counter, for example, can also be used provided that the counter is of the structure to generate plural delay signals each having the delay time which is different from that of a clock signal.

In the delay block section 10, two inverters are connected for each step so that a duty of a clock signal may be maintained up to the last step without being destroyed. It is preferable that the number of branches of each invertor and the number of fan-outs are made to be the same, and thereby dispersion of each step is inhibited to the minimum.

Though the number of steps of the delay element group is not restricted in particular, it is possible to detect the standard signal taking a change in delay time of each delay element into consideration, and it is safe to prepare the number of steps which enables to obtain the desired delay time, because there is a possibility that the delay time in each delay element is varied within a range of ⅓–3 times that of type value, by environmental changes such as temperature variation in an integral circuit.

For the state control section 20, outputting is conducted by extracting a partial portion such as a neighborhood of DL100 (DL098–DL101), a neighborhood of DL200 (DL198–DL201), a neighborhood of DL300 (DL298–DL301) and DL399 of the last step.

Incidentally, for the area other than delay elements outputted to the state control section 20 through the extraction mentioned above, it is also possible to provide a small number of delay elements each having long delay time, in place of providing a large number of delay elements each having short delay time. Accuracy of delay in delay elements outputted to the state control section 20 through extraction as stated above has an influence on the final accuracy.

Other portions will also be explained as follows, using the numerical values matching with the delay signals from 400 steps of delay elements each having uniform delay time. However, the numerical values shown here represent just an example, and they can be varied in many ways depending upon the elements to be used, the number of steps of the elements, and the required numerical values.

Figure 3:
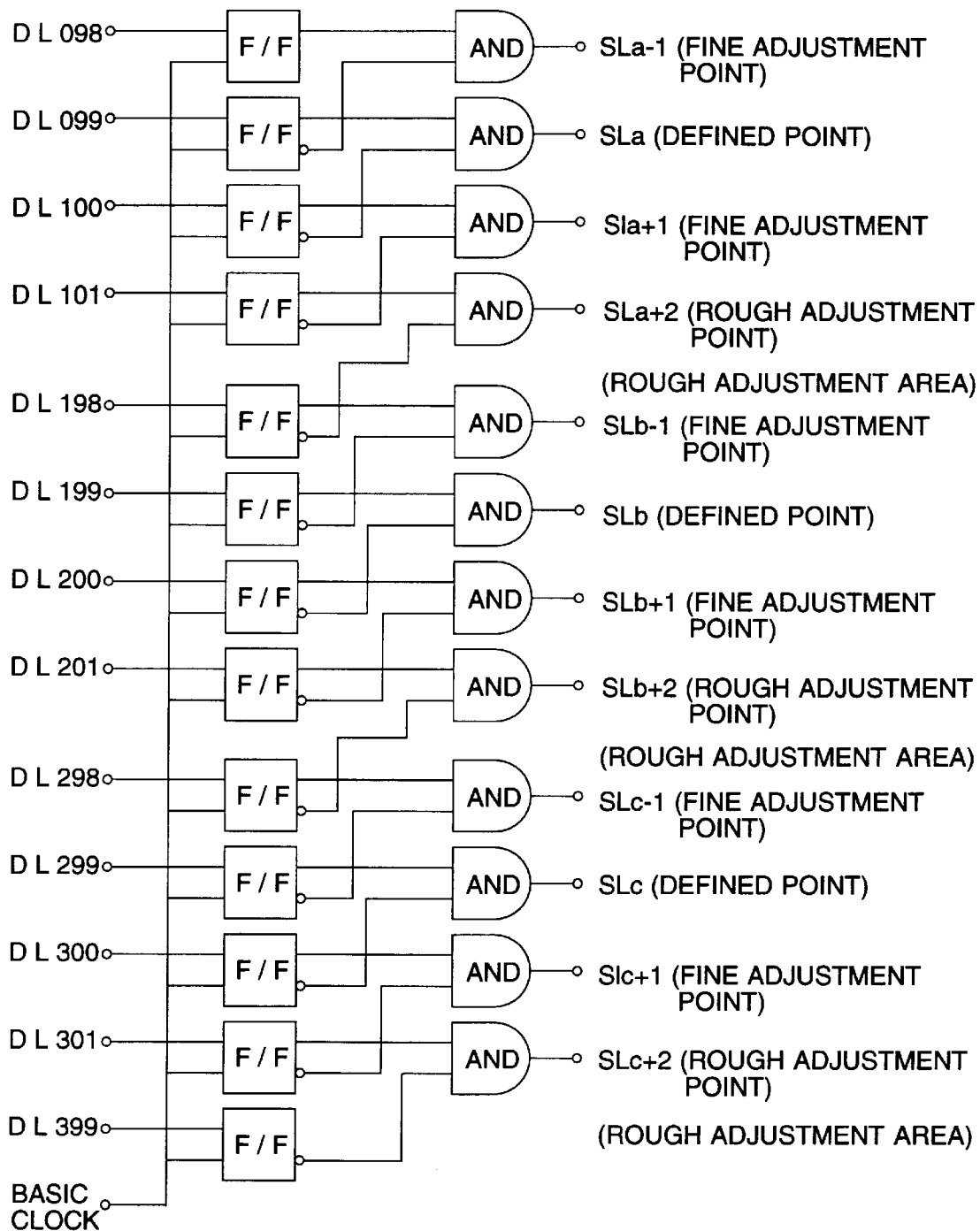
FIG. 3 is a structure diagram showing an example of the detailed structure of a state control section used in the example of the invention.

FIG. 3 is a structure diagram showing an example of the structure of the state control section 20. This state control section 20 is not just for state detection, but it generates select signals SLxxx (SLx−1, SLx, SLx+1, SLx+2: wherein x represents any of a–c) which show stepwise the state of adjustment point for the control to realize the state established in advance.

Therefore, when comparing with mere state detection as those in the past, it has become possible to realize higher accuracy with less information of detection. Incidentally, let it be assumed that a combination of state detection and control like that in the present example is called the state control.

In the example shown in FIG. 3, three states established in advance (defined, fine adjustment, rough adjustment) are assumed, and three defined points (SLa, SLb, SLc), fine adjustment points (SLa−1, SLa+1, SLb−1, SLb+1, SLc−1, SLc+1) which are adjacent to both sides of the defined point, and rough adjustment points (SLa+2, SLb+2, SLc+2) which are adjacent to the fine adjustment point on one side, are provided.

An output signal from the delay block section 10 and a standard clock are received respectively by each flip-flop, and those wherein a Q output of the flip-flop and an inverted Q output of the adjoining flip-flop are subjected to logical AND are outputted as each point (defined point, fine adjustment point, rough adjustment point).

Owing to the structure mentioned above, a select signal at H level is outputted to the point of delay signal nearest to the signal delayed from the standard clock exactly by one cycle, and signals at L level are outputted to all other points.

Figure 5:
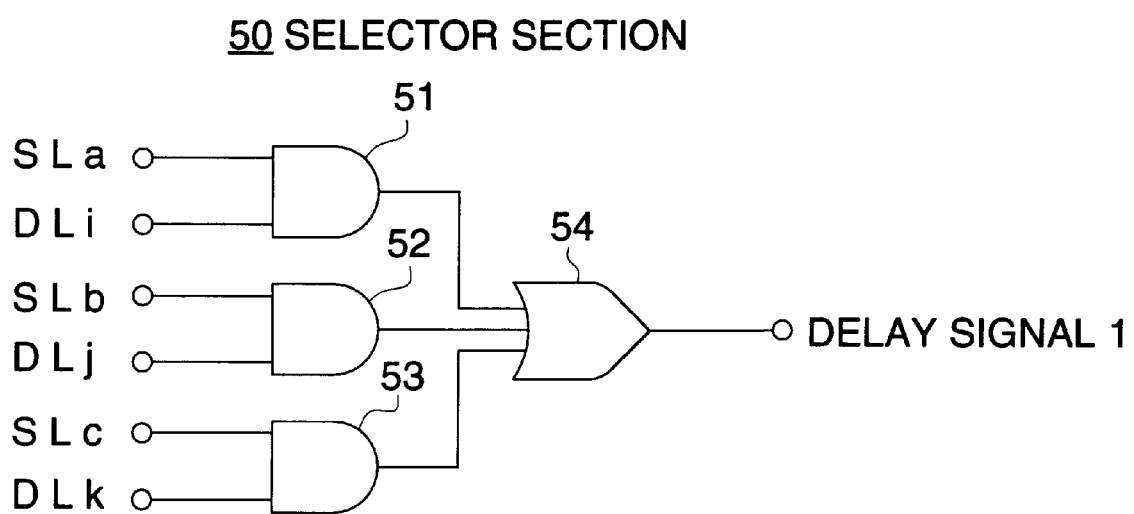
FIG. 5 is a structure diagram showing an example of the detailed structure of a selector section used in the example of the invention.

Incidentally, the structure of the circuit is not limited to that shown in FIG. 5 provided that the circuit can output select signal SL like that mentioned above, and those including one wherein the flip-flop is replaced with others and one wherein a logic is inverted can also realize in the same way.

In particular, when an input signal is a clock signal, it is possible to detect the relation of the same phase (phase difference is a multiple of an integer of one cycle) or the relation of the reversed phase (phase difference is a multiple of an odd number of a half cycle). In the present specification, therefore, it is assumed that the relation wherein the delay signal is in the phase that is the same as or opposite to that of the clock signal is called the relation of phase synchronization. Incidentally, for the reason mentioned above, the present example is structured so that the delay signal which is in the relation of the same phase may be detected.

Then, receiving select signals from the state control section 20, heat control section 30 generates heat control signal (fine adjustment (up/down), defined (adjustment maintenance) and rough adjustment (up) which correspond respectively to the select signals.

Figure 4:
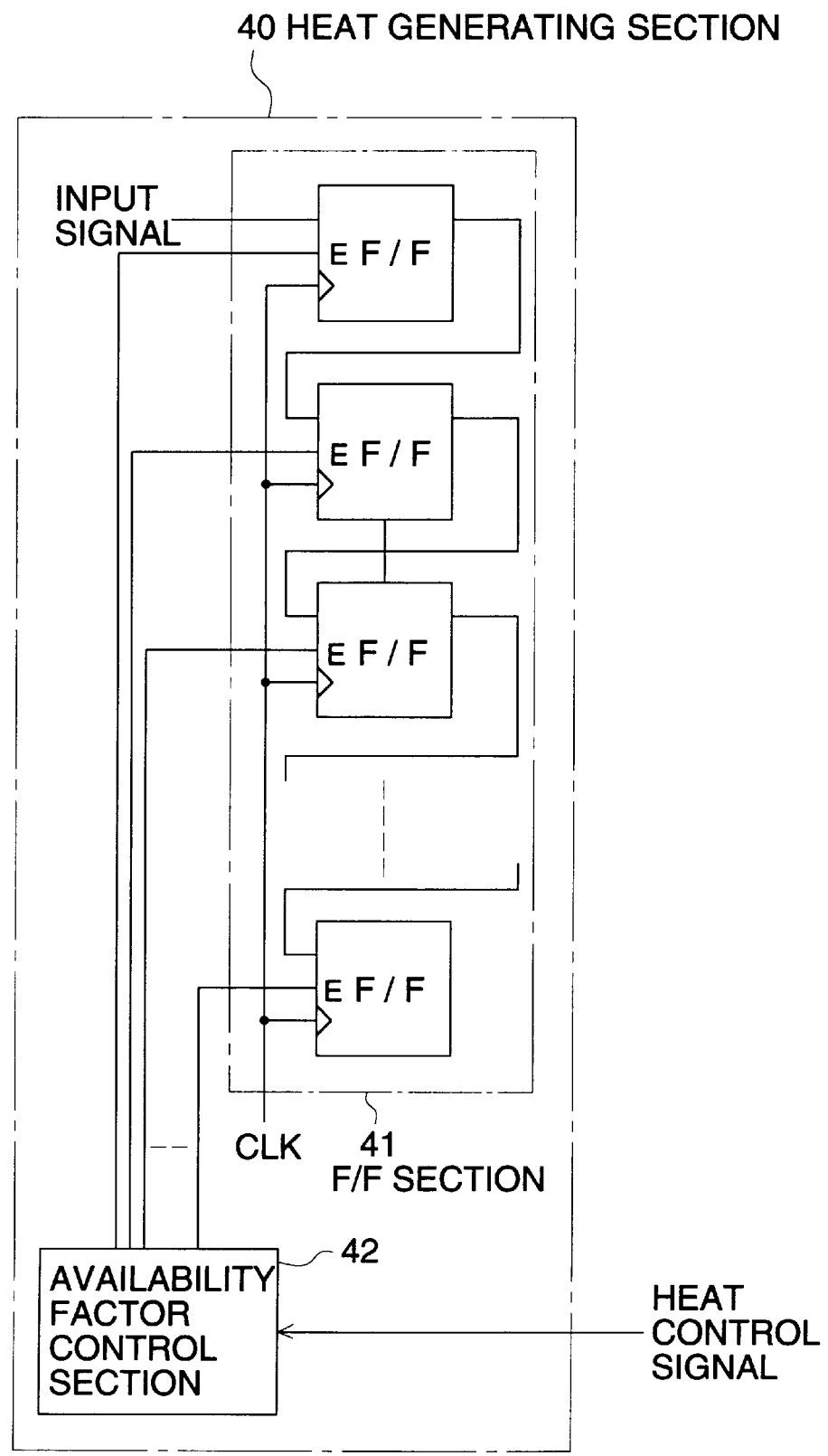
FIG. 4 is a structure diagram showing an example of the detailed structure of a heat generating section used in the example of the invention.

FIG. 4 is a structure diagram showing the structure of heat generating section 40. The heat generating section 40 is a circuit to generate heat efficiently and the availability factor thereof is changed in accordance with heat control signals. A multi-bit shift register, a counter and an invertor chain are included in as the heat generating section. In this case, there is exemplified the structure wherein a shift register by flip-flop is used, and F/F section 41 and availability factor control section 42 are provided therein.

Namely, this heat generating section 40 is composed of F/F section 41 that has an enable terminal and is composed of plural steps of flip-flop generating heat when driven and of the availability factor control section 42 which receives heat control signals and controls availability factor.

In this case, it is preferable that the circuit can generate heat efficiently, and a structure other than the exemplified one employing the flip-flop may also be used. It is necessary to find in advance the extent of heat generated, and the extent of delay obtained, both by controlling the availability factor, and including the appropriate number of steps.

FIG. 5 is a structure diagram showing an example of the structure of selector section 50. In the selector section 50, delay signals (DLi, DLj, DLk) from the delay block section 10 selected in advance for select signals (SLa, SLb, SLc) of either defined point, are combined and connected as an input of AND circuits 51–53. Thereby, output of AND circuits 51–53 is generated to the outside as delay signal 1 through OR circuit 54.

Assuming that one cycle of the standard clock is 100 ns, desired delay time is 30 ns, defined points are 100th, 200th and 300th delay elements, and each of select signals SLa, SLb and SLc of the defined point corresponds to each defined point, the concrete example in that case will be explained as follows.

Let it be assumed that the signal (the reference delay signal) that is delayed from the standard clock exactly by one cycle agrees with a defined point at the 100th delay element. In this case, the signal outputted from the delay element at the 100th step is supposed to be delayed from the standard clock exactly by 100 ns. Since the delay time of each delay element is uniform, the signal with the desired delay time of 30 ns is supposed to be outputted from the delay element at the 30th step. Therefore, in this case, the delay element at the 30th step is deemed as the second delay element and DLi is set so that it represents the signal from the delay element at the 30th step.

In the same manner, DLj is set so that it represents the signal from the delay element at the 60th step corresponding to the defined point at the 200th step, and DLK is set so that it represents the signal from the delay element at the 90th step corresponding to the defined point at the 300th step.

Due to the environmental conditions, it is uncertain which of the 100th step, 200th step or 300th step will be for the defined point as the first delay element, but when the defined point at either step is agreed, the select signal corresponding to that defined point is outputted and a delay element corresponding thereto is selected as the second delay element.

Regardless of any select signal selected, it is sure that the delay elements (DLi, DLj, DLk) each corresponding to each condition are delayed from the standard clock by 30 ns.

Owing to the structure of the invention, even when the delay element at the 400th step is used, only two steps (see FIG. 5: the first step corresponds to 51–53, and the second step corresponds to 54) are enough for the selector, which shows that remarkable effects can be expected, when comparing with the aforesaid conventional method wherein 9 steps of selectors are required.

Owing to the structure mentioned above, delay signals (DLi, DLj, DLk) selected in advance to correspond to select signals can be outputted to the outside. Incidentally, though there is exemplified here an occasion wherein delay signal 1 only is outputted, the invention is not limited to this example, but it is possible to select and output two kinds of delay signals, or more delay signals.

Incidentally, as an assignment method for both select signals and delay signals, there are considered various methods, and they can be selected depending on necessary accuracy of the delay time.

By selecting with a circuit in which the number of steps is much less than that in the conventional selector section, it is possible to inhibit an error generated in the step of the selector section to the minimum.

Now, the relation between an amount of heat at heat generating section 40 and delay at delay block section 10 will be explained as follows.

Causes for variation of delay in a semiconductor element are considered to be temperature, power voltage and dispersion in process. Among them, control of the temperature is watched. Namely, it is an object to control to the desired delay state by controlling within a range of allowed temperature, paying attention to the characteristic of a free electron that its movement becomes slow as temperature rises.

Now, time t PLH required to rise and time t PHL required to fall are considered. Incidentally, let it be assumed that KT represents a temperature coefficient, KU represents a power voltage coefficient, and KP represents a process coefficient.

Rise time t PLH under the minimum condition:

t PLH (min)=t PLH (typ)×KT×KU×KP (min) Fall time t PHL under the minimum condition:

t PHL (min)=t PHL (typ)×KT×KU×KP (min) Rise time t PLH under the maximum condition:

t PLH (max)=t PLH (typ)×KT×KU×KP (max) Fall time t PHL under the maximum condition:

t PHL (max)=t PHL (typ)×KT×KU×KP (max)

The rise time and the fall time mentioned above are recognized as characteristics of a semiconductor, and various variations in manufacturing are taken into consideration for the design of the semiconductor.

Next, delay variation caused by heat which is watched in the invention will be obtained by calculation.

As an example, calculation will be made here for the occasion of 0.8 $\mu$m CMOS silicone gate array 2-layer Al wiring process QFP package.

Power consumption required for continuous operation of flip-flop of the QFP package at 60 MHz is as follows.

$$P = \Sigma\{(\text{operating cycle [MHz]}) \times (\text{number of gates}) \times (\text{operating efficiency}) \times 4.5\}$$

$$= 60 \times 5 \times 1 \times 4.5$$

$$= 1.35 \text{ mW}$$

Next, heat T generated by the power consumption mentioned above is as follows, when Qja represents heat resistance of the master package.

$$T = (Qja [°C/W]) \times (P [W])$$

$$= 54 \times 0.00135$$

$$= 0.073° \text{ C}$$

Next, since temperature coefficient KT1 per 1° C. is

KT1=0.0026, heat generation T100 in 100 steps of flip-flop is

T100=7.3° C., and temperature coefficient KT7.3 in the course of the heat generation is as follows.

KT7.3=0.01898

Therefore, delay increment t 100 of delay block section A 100 under the aforesaid condition is as follows.

$$t\ 100 = t\ (\text{typ } 100) \times Kt7.3$$

$$= (0.1 \text{ [nS]} \times 100 \text{ [steps]}) \times 0.01898$$

$$= 0.1898 \text{ nS}$$

Incidentally, since this value shows a delay increment for temperature rise of the package, there is a possibility that a delay increment inside the device is greater than the value mentioned above.

The characteristic of the present example is that a necessary delay amount and an availability factor of F/F section 41 are obtained in advance with a reference of the aforesaid delay increment caused by heat, and availability factor control section 42 controls the availability factor of the F/F section 41 in accordance with heat control signals, thereby the delay amount in delay block section 10 is controlled to approach the desired amount.

Incidentally, since there are two ways for controlling heat generation (delay increase/delay decrease), it is possible to take an action wherein a certain amount of heat is generated, and then, the heat is increased or decreased.

Incidentally, though the heat generation is controlled by the operation of an electronic circuit in the present example, an element capable of controlling heat absorption can also be used. In the case of heat absorption, what is required to do is to control an amount of heat to be absorbed from heat generated through operation of the delay block section 10.

Now, operations in the first example will be explained as follows, referring to a flow chart in FIG. 6 and time charts in FIG. 7 and thereafter.

First, in the initial state, heat generating section 40 generates heat in quantity established in advance. State control section 20 that has received, under the aforesaid state, a part of delay signals extracted from delay block section 10 generates select signal SLxxx showing a position of the delay signal which is closest to the signal that is delayed from the standard clock exactly by one cycle (FIG. 6 S1).

Then, heat generating section 30 generates, in accordance with the select signal SLxxx, heat control signal HCONT which makes the prescribed delay state established in advance, and supplies it to heat generating section 40.

Figure 6:
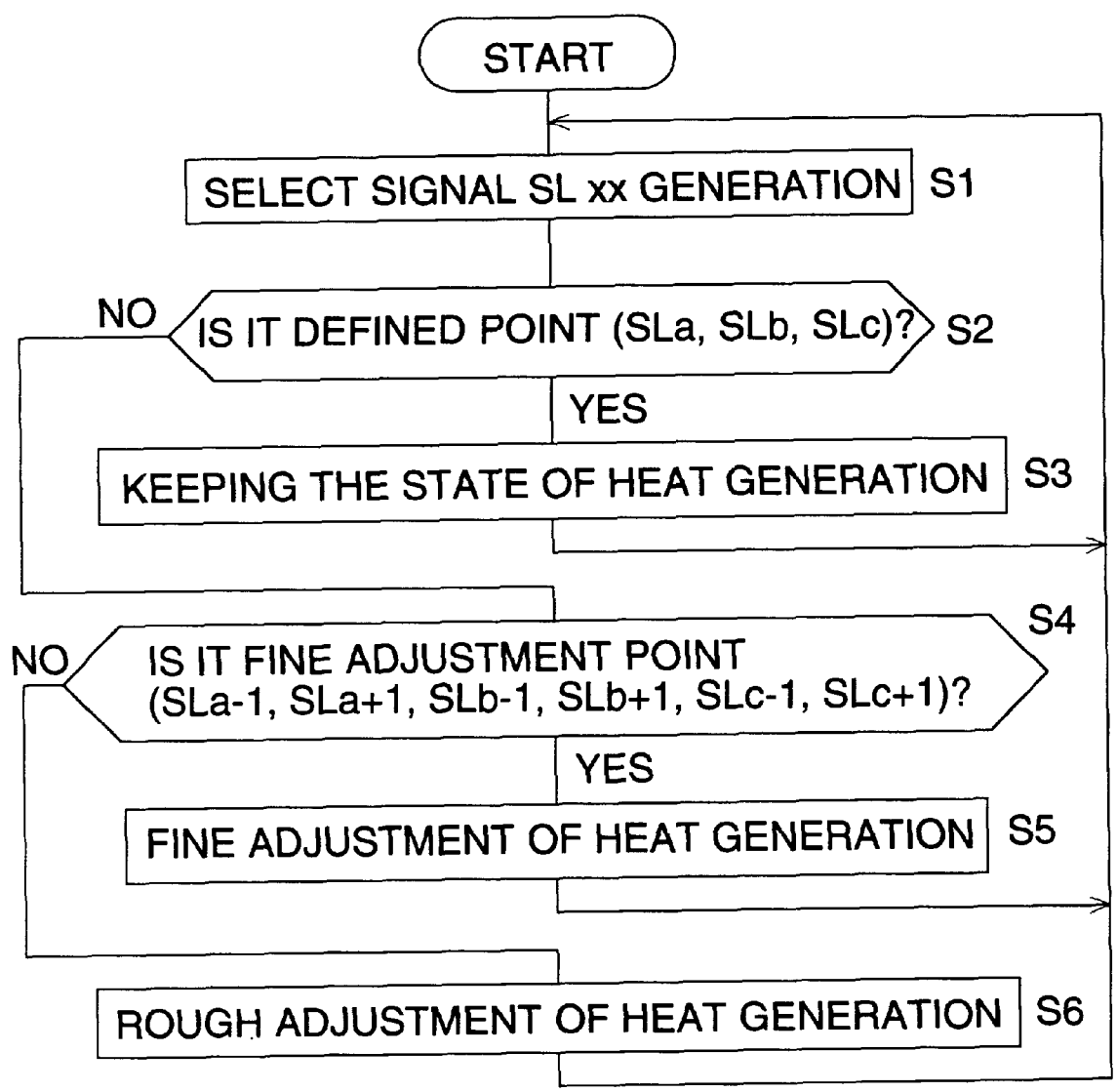
FIG. 6 is a flow chart showing the state of operations in the example of the invention.

Namely, it is checked first whether select signals (SLa, SLb, SLc) of defined point showing the prescribed delay state have been generated or not (S2 in FIG. 6), and if the defined point is observed, heat control signal HCONT that keeps the state of heat generation is generated (S3 in FIG. 6).

Further, it is checked whether select signals (SLa−1, SLa+1, SLb−1, SLb+1, SLc−1, SLc+1) of fine adjustment point showing the state deviated slightly from the prescribed delay state have been generated or not (S4 in FIG. 6), and if the fine adjustment point is observed, heat control signal HCONT that finely adjusts the state of heat generation is generated (S5 in FIG. 6).

When neither defined point nor fine adjustment point is observed, the state is supposed to be one wherein select signals SLa+2, SLb+2, SLc+2) of rough adjustment point showing the state deviated considerably from the prescribed delay state are generated. Therefore, heat control signal HCONT that adjust roughly the state of heat generation is generated (S6 in FIG. 6).

By detecting the state of adjustment points and by controlling (state control) through three kinds of rough adjustment, fine adjustment and defined heat controls to realize a defined point as stated above, it is possible to realize higher accuracy with less detection information, compared with the mere detection of the state like those in the past.

[1] Heat Adjustment:

Now, the state of delay of delay signals of delay block section 10 and how select signals SL xxx of state control section 20 are generated will be explained as follows, referring to time charts in FIG. 7 and thereafter. Incidentally, in each of the explanations in FIG. 7 and thereafter, there is shown an example wherein heat adjustment is conducted with either one in the vicinity of delay signals DL198–DL201. The explanation will be conducted in the order of rough adjustment and fine adjustment.

Figure 7:
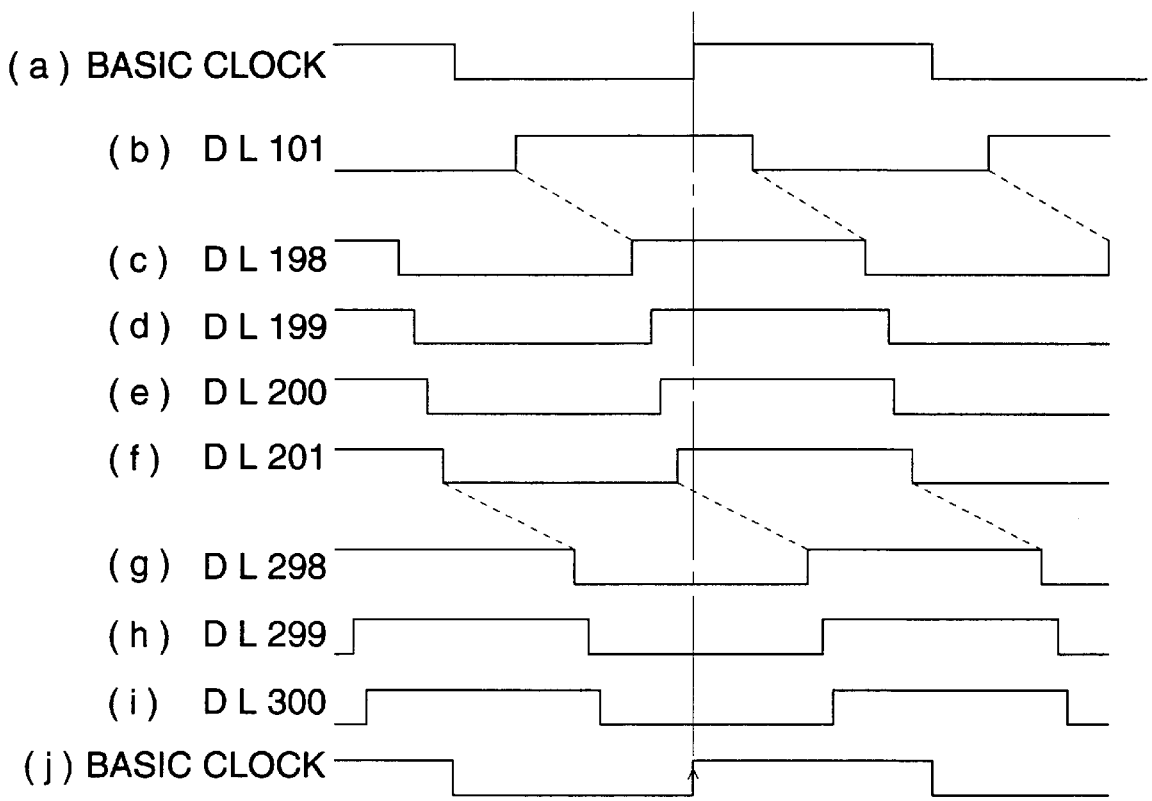
FIG. 7 is a time chart for illustrating how select signals are generated in the example of the invention.

(1) Rough Adjustment:

FIG. 7 shows the state wherein the rise of delay signal DL201 (FIG. 7(f)) is directly followed by the rise of the standard clock (FIG. 7(j)).

Under this state, H level is only for the output of AND circuit (select signal SLb+2) receiving Q output of flip-flop which has received delay signal DL201 in state control section 20 in FIG. 3 and receiving inverted Q output of flip-flop which has received delay signal DL298, and L level is for output of other AND circuits.

Since this select signal SLb+2 is a rough adjustment point, heat control section 30 generates heat control signal HCONT which is for rough adjustment. Then, heat generating section 40 which has received the heat control signal HCONT conducts rough adjustment for heat to enhance an availability factor.

Figure 8:
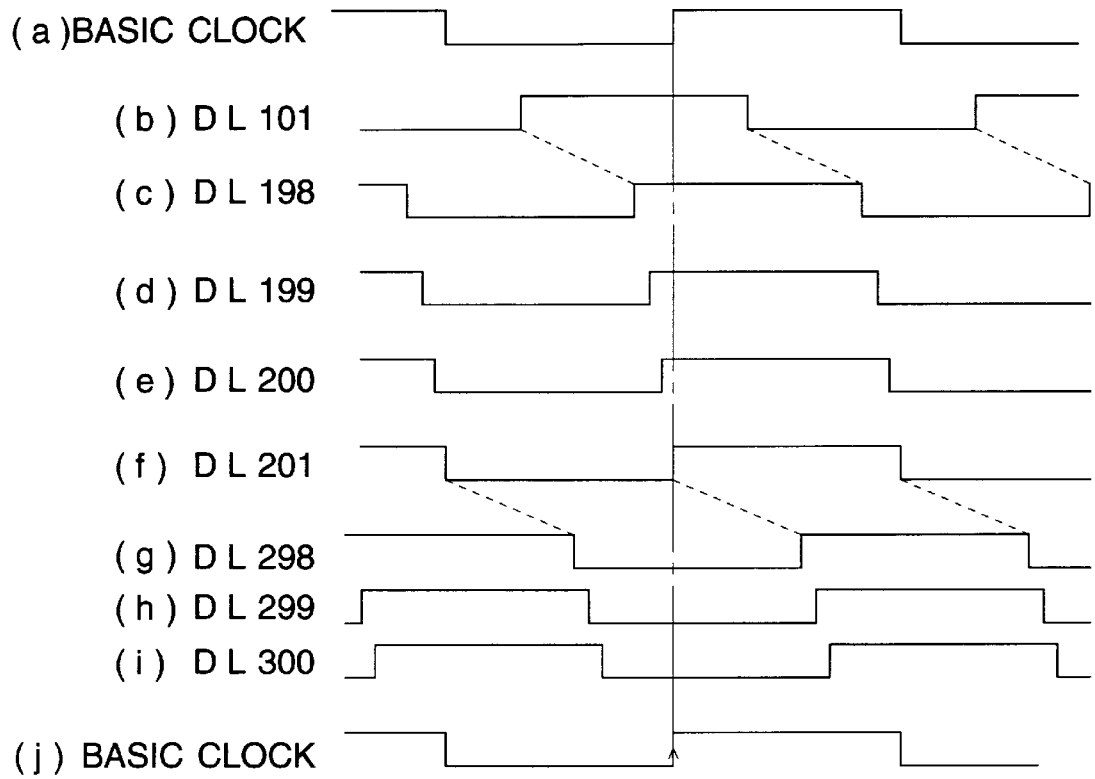
FIG. 8 is a time chart for illustrating how select signals are generated in the example of the invention.

(2) Fine Adjustment:

FIG. 8 shows the state wherein the rise of the standard clock (FIG. 8(j)) comes between the rise of delay signal DL200 (FIG. 8(e)) and the rise of DL201 (FIG. 8(f)).

Under this state, H level is only for the output of AND circuit (select signal SLb+1) receiving Q output of flip-flop which has received delay signal DL200 in state control section 20 in FIG. 3 and receiving inverted Q output of flip-flop which has received delay signal DL201, and L level is for output of other AND circuits.

Since this select signal SLb+1 is a rough adjustment point, heat control section 30 generates heat control signal HCONT which is for rough adjustment. Then, heat generating section 40 which has received the heat control signal HCONT conducts fine adjustment for heat to enhance an availability factor.

Figure 9:
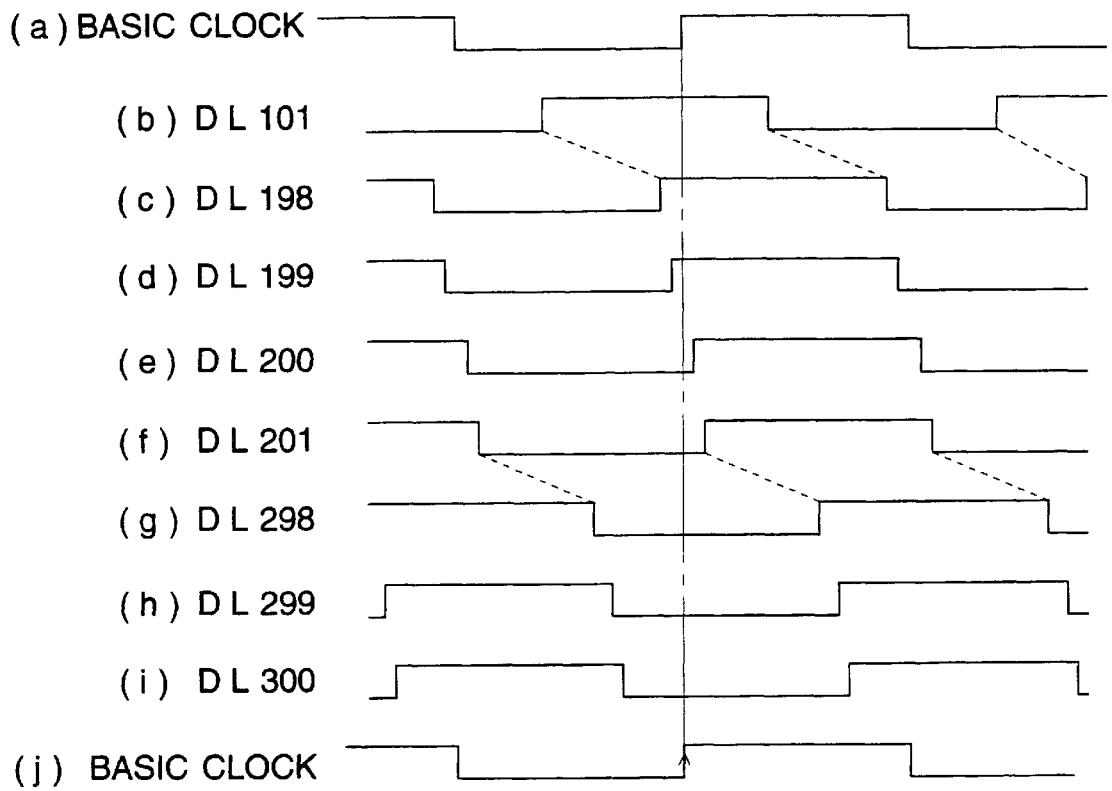
FIG. 9 is a time chart for illustrating how select signals are generated in the example of the invention.

(3) Adjustment Maintenance:

FIG. 9 shows the state wherein the rise of the standard clock (FIG. 9(j)) comes between the rise of delay signal DL199 (FIG. 9(d)) and the rise of DL200 (FIG. 9(e)).

Under this state, H level is only for the output of AND circuit (select signal SLb) receiving Q output of flip-flop which has received delay signal DL199 in state control section 20 in FIG. 3 and receiving inverted Q output of flip-flop which has received delay signal DL200, and L level is for output of other AND circuits.

Since this select signal SLb is a defined point, heat control section 30 generates heat control signal HCONT which is for adjustment maintenance. Then, heat generating section 40 which has received the heat control signal HCONT conducts adjustment for the state maintenance for maintaining the availability factor.

(4) Fine Adjustment:

FIG. 10 shows the state wherein the rise of the standard clock (FIG. 10(j)) comes between the rise of delay signal DL198 (FIG. 10(c)) and the rise of DL199 (FIG. 10(d)).

Under this state, only output (select signal SLb-1) of AND circuit receiving Q output of flip-flop which has received delay signal DL198 and inverted Q output of flip-flop which has received delay signal DL199 turns out to be at an H level, in state control section 20 in FIG. 3. While, output of other AND circuits turn out to be at an L level.

Since this select signal SLb-1 is a fine adjustment point, heat control section 30 generates heat control signal HCONT which is for fine adjustment. Then, heat generating section 40 which has received the heat control signal HCONT conducts fine adjustment for heat to lower slightly an availability factor.

By detecting the state of adjustment points and by controlling through three kinds of rough adjustment, fine adjustment and defined heat controls to realize a defined point as stated above, it is possible to realize higher accuracy with less detection information, compared with the mere detection of the state like those in the past.

Though the heat control to converge to the select signal SLb is conducted in the foregoing, it is also possible to conduct heat control to converge to SLa or SLc through the same heat control.

[2] Selection of Delay Signals:

Next, selection of a delay signal in selector section 50 which is conducted in parallel with the heat control mentioned above will be explained.

The selector section 50 selects the delay signal assigned in advance to have the prescribed delay time, referring to select signals SLx (SLa, SLb, SLc) of defined point among select signals SLxxx generated from state control section 20, or to defined select signals SLx (SLa, SLb, SLc) adjusted by the heat control section 30.

Namely, when select signal SLa is displayed (to be H level), delay signal DLi is outputted to the outside as delay signal 1.

When select signal SLb is displayed (to be H level), delay signal DLj is outputted to the outside as delay signal 1.

When select signal SLc is displayed (to be H level), delay signal DLk is outputted to the outside as delay signal 1.

With regard to the delay signals DLi–DLn in this case, what is required to do is to select in advance those wherein the desired delay time can be obtained when each select signal SLx (SLa, SLb, SLc) is displayed, and to assign them in selector section 50.

Incidentally, at the moment when select signal SLxxx from the state control section 20 enters fine adjustment point (SLx-1, SLx+1) or rough adjustment point (SLx+2) around a defined point, the heat control section 30 can generate defined select signal Slx (SLa, SLb, SLc) corresponding to the select signal of the defined point and supply it to selector section 50 in parallel with heat control. This defined select signal can be generated with OR circuit through the receiving of select signals of fine adjustment or rough adjustment.

Even when a defined select signal corresponding to a defined point is used at the step of rough adjustment or fine adjustment as stated above, no problem is caused because the actual defined point is reached at the timing within several clocks by heat control. Further, since selector section 50 is operated by the defined select signal as that mentioned above, delay signals to be outputted to the outside are not interrupted even in the case of the momentary delay state other than the defined point.

The delay signal thus obtained is outputted, for example, to a PMW circuit of an image forming apparatus. However, it is possible to provide an arrangement next to (or inside) the selector section 50 to be capable of controlling whether to output or not, so that delay signals may not be outputted when the PWM circuit does not need the delay signals.

Since there is a period (so-called retrace line period) wherein no delay signal is needed horizontally or vertically in an image forming apparatus, it is preferable that the control to change the defined point is conducted in the retrace line period and fine adjustment is made in the period where delay signals are needed.

Incidentally, as a means to determine output signals, it is also considered to utilize a CPU that is located outside a signal delay apparatus in place of the selector section 50 mentioned above. Namely, it is also possible to calculate the aforesaid assignment one after another and to output the delay signal having the desired delay time, by connecting delay block section 10, state control section 20 and heat control section 30 to the outside CPU and by further controlling with a software.

By detecting the state of adjustment points and by controlling through three kinds of rough adjustment, fine adjustment and defined heat controls to realize a defined point as stated in detail above, it is possible to realize higher accuracy with less detection information, compared with the mere detection of the state like those in the past. In addition, due to less information of detection, processing can be conducted rapidly.

By selecting after controlling to converge to the defined point as stated above, selection can be conducted by circuits in quantity which is much less than that in the conventional selector section, and thereby, an error generated at the step of the selector section can be inhibited to be extremely small.

Further, even when the number of steps of delay block section 10 is increased for improving accuracy (resolution), a problem of an increase in errors experienced in the past is not caused because heat control and selection are conducted with less information of detection.

In addition, the number of steps of the delay block section 10 has only to be increased for improving the accuracy, and it is advantageous for integration, because it is not necessary to increase the scale of circuits in the selector section.

It is further possible to absorb an influence of heat caused by a change with time or by a change in environmental temperature, because heat is positively used for the control.

Since the present invention having the structure mentioned above can be constituted only of digital circuits, it can be provided in a single integral circuit. At least delay block section 10 and heat generating section 40 can be provided in a single integral circuit to be kept in the heat-coupled state.

The signal delay apparatus in the present example can be structured on a single integrated circuit as a digital circuit totally, and it can be used for synchronization of data transmission in an image forming apparatus such as a laser beam printer, a copying machine and a facsimile receiver.

Further, the signal delay apparatus can be used for making three timing signals including an RAS signal determining a line address, a CAS signal determining a row address and an R/C signal for switching the RAS signal and the CAS signal, and can be adapted to generation of CCD reset pulses, in RAM. In addition, it can be applied to the objects for the delay line used in the past, such as to conducting rapid processing in a multi-clock generating circuit, or to conducting phase agreement between an outer clock and an inner clock by using a clock phase synchronization circuit, or to generating clocks synchronized with the outer clock in a synchronization signal generating circuit.

By detecting the state of the partial extracted delay signals (adjustment points) and by controlling through stepwise heat control to realize a defined point and by selecting the delay signal assigned in advance referring to information of select signals, it is possible to conduct accurate state detection rapidly with less information of detection, and to inhibit an error to be extremely small through the selection at the circuits whose quantity of steps is much less than that in the conventional selector section, in the signal delay apparatus of the invention, as stated in detail above.

Further, by detecting the state of the partial extracted delay signals (adjustment points) and by controlling through stepwise heat control to realize a defined point and by selecting the delay signal assigned in advance referring to information of select signals of the defined point, it is possible to conduct the accurate state detection rapidly with less information of detection, and to inhibit an error to be extremely small through the selection at the circuits whose quantity of steps is much less than that in the conventional selector section, in the signal delay apparatus of the invention.

In the invention stated above, even when the number of steps in the delay section is increased for improving accuracy (resolution), a problem of an increase in errors experienced in the past is not caused because heat control and selection are conducted with less information of detection. Further, the number of steps in the delay section has only to be increased, and the circuit scale of the selection section is not necessary to be increased for improving accuracy, which is advantageous for integration. It is further possible to absorb an influence of heat caused by a change with time or by a change in environmental temperature, because heat is positively used for the control.

Further, since all circuits can be constituted with a digital circuit, it is possible to make the cost of the delay line to be a small fraction of the conventional cost, and expansion is also possible. In addition, by utilizing a one chip integral circuit the such as a gate array, the conventional problem of interference in a delay line to be attached outside is avoided, and thus the problem of signal noise can be solved.

What is claimed is:

1. An integrated circuit comprising a delay signal generating apparatus for generating a desired delay signal, said delay signal apparatus comprising:

a plurality of delay elements which are connected serially for delaying an input signal successively such that the plurality of delay elements output a plurality of delay signals each having a different delay time with respect to the input signal;

a heater comprising a plurality of digital elements for heating the plurality of delay elements;

a heat controller for controlling an availability factor of the heater by selectively operating respective ones of the plurality of digital elements so as to adjust a heat amount generated by the heater and thereby control the delay time of each of the plural delay signals; and a selector for selecting the desired delay signal from among the plurality of delay signals.

2. The integrated circuit of claim 1, wherein:

a first delay element is predetermined from among the plurality of delay elements; and the heat controller controls the heat amount such that a reference delay signal outputted from the first delay element has a predetermined phase relationship with the input signal.

3. The integrated circuit of claim 2, wherein the predetermined phase relationship is set such that a phase difference between the input signal and the reference delay signal corresponds to one cycle of the input signal.

4. The integrated circuit of claim 2, wherein the predetermined phase relationship is set such that a phase difference between the input signal and the reference delay signal corresponds to a half cycle of the input signal.

5. The integrated circuit of claim 2, wherein:

the selector selects one of the first delay element and a second delay element so as to output the desired delay signal; and the second delay element has a predetermined positional relationship with the first delay element.

6. The integrated circuit of claim 2, wherein:

a limited number of the delay elements are predetermined among the plurality of delay elements, and the first delay element is one of the limited number of the delay elements; and the heat controller controls the heater according to a relationship between the input signal and delay signals outputted from the limited number of the delay elements so that the reference delay signal outputted from the first delay element has the predetermined phase relationship with the input signal.

7. The integrated circuit of claim 5, wherein:

a limited number of the delay elements are predetermined among the plurality of delay elements, and the first delay element is one of the limited number of the delay elements; and the heat controller controls the heater according to a relationship between the input signal and delay signals outputted from the limited number of the delay elements so that the reference delay signal outputted from the first delay element has the predetermined phase relationship with the input signal.

8. The integrated circuit of claim 1, wherein the plurality of delay elements each output delay signals having a same delay time.

9. An integrated circuit comprising a delay signal generating apparatus for generating a desired delay signal, said delay signal apparatus comprising:

a plurality of delay elements which are connected serially for delaying an input signal successively such that the plurality of delay elements output a plurality of delay signals each having a different delay time for the input signal, wherein a limited number of the delay elements are predetermined among the plurality of delay elements, and a first delay element is predetermined among the limited number of delay elements;

a heater comprising a plurality of digital elements for heating the plurality of delay elements;

a heat controller for controlling an availability factor of the heater by selectively operating respective ones of the plurality of digital elements so as to adjust a heat amount generated by the heater and thereby control the delay time of each of the plural delay signals, wherein the heat controller controls the heater according to a relationship between the input signal and delay signals outputted from the limited number of the delay elements so that a reference delay signal outputted from the first delay element has a predetermined phase relationship with the input signal.

10. An image forming apparatus comprising an integrated circuit having a delay signal generating apparatus for generating a desired delay signal, said delay signal apparatus comprising:

a plurality of delay elements which are connected serially for delaying an input signal successively such that the plurality of delay elements output a plurality of delay signals each having a different delay time with respect to the input signal;

a heater comprising a plurality of digital elements for heating the plurality of delay elements;

a heat controller for controlling an availability factor of the heater by selectively operating respective ones of the plurality of digital elements so as to adjust a heat amount generated by the heater and thereby control the delay time of each of the plural delay signals; and a selector for selecting the desired delay signal from among the plurality of delay signals.

* * * * *

UNITED STATES PATENT AND TRADEMARK OFFICE
CERTIFICATE OF CORRECTION

PATENT NO. : 6,060,929
DATED : May 9, 2000
INVENTOR(S) : Kouichi Takaki et al.

Page 1 of 1

It is certified that error appears in the above-identified patent and that said Letters Patent is hereby corrected as shown below:

Title page,
Item [56], References Cited under "U.S. PATENT DOCUMENTS",
insert -- 4,494,021  1/85  Bell et al.
5,428,309  6/95  Yamauchi et al.
5,764,092  6/98  Wada et al. --.

Abstract, Item [57],
Line 2, delete ",".

Signed and Sealed this

Thirteenth Day of November, 2001

Attest:

NICHOLAS P. GODICI
Attesting Officer
Acting Director of the United States Patent and Trademark Office